United States Patent [19]

Ahrenkeil

[11] 4,165,471
[45] Aug. 21, 1979

[54] OPTICAL SENSOR APPARATUS

[75] Inventor: Richard K. Ahrenkeil, Los Alamos, N. Mex.

[73] Assignee: Eastman Kodak Company, Rochester, N.Y.

[21] Appl. No.: 818,693

[22] Filed: Jul. 25, 1977

[51] Int. Cl.² .................. H03K 3/42; H01L 29/78; H01L 27/14; H01L 31/00
[52] U.S. Cl. ........................... 307/311; 357/23; 357/30; 357/61; 250/211 J
[58] Field of Search ............ 307/311; 357/24, 30, 357/23; 250/211 J; 204/15, 56 R

[56] References Cited

U.S. PATENT DOCUMENTS

| | | | |
|---|---|---|---|
| 3,623,026 | 11/1971 | Engeler et al. | 357/30 |
| 3,786,263 | 1/1974 | Michon | 357/24 |
| 3,805,062 | 4/1974 | Michon et al. | 357/24 |
| 3,877,057 | 4/1975 | Engeler | 357/24 |
| 3,929,589 | 12/1975 | Ermanis et al. | 357/61 |
| 4,000,418 | 12/1976 | Waldron et al. | 357/24 |
| 4,034,396 | 7/1977 | Nakamura et al. | 357/30 |

OTHER PUBLICATIONS

Ahrenkiel et al., "Low Dark-Current MOS Photodiodes Using GaAs$_{0.6}$P$_{0.4}$," J. Applied Physics, vol. 48 (1/77), pp. 267-269.

Ikoma et al., "C-V Characteristics of GaP MOS Diode with Anodic Oxide Film," IEEE Trans. Electron Devices, vol. ED-23 (5/76), pp. 521-523.

Hartnagel, "MOS-Gate Technology on GaAs and Other III-V Compounds," J. Vac. Sci. Technol., vol. 13 (7-8/76), pp. 860-867.

Forbes et al., "Characteristics and Potential Applications of GaAs$_{1-x}$P$_x$ MIS Structures," Solid-State Electronics, vol. 17 (1/74), pp. 25-29.

Primary Examiner—William D. Larkins
Assistant Examiner—Gene M. Munson
Attorney, Agent, or Firm—Robert F. Cody

[57] ABSTRACT

A light sensing apparatus is described which employs a GaAsP MOS light-receiving element to which a potential is applied for creating a depletion region. Upon exposure, minority carriers are generated and trapped. Light levels are sensed by a charge injection technique which results in a characteristic charge or voltage, the magnitude of which is proportional to the total exposure during the sensing period.

6 Claims, 2 Drawing Figures

FIG. 1
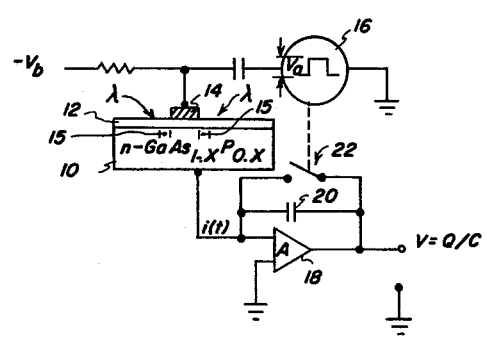
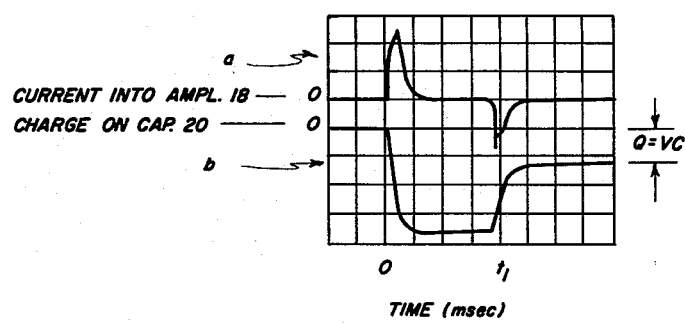
FIG. 2

4,165,471

OPTICAL SENSOR APPARATUS

BACKGROUND OF THE INVENTION

1. Field of the Invention

This invention relates in general to a light sensing apparatus, and in particular to a light sensing apparatus employing a solid state light sensing MOS structure characterized by extremely low dark current (and corollarily long charge-holding capability, as well as the capability of sensing extremely low light levels) and spectral sensitivity that may correspond very precisely to the visible spectrum.

2. Description Relative to the Prior Art

Although solid state image sensing has generally been based on the use of silicon, its band gap of 1 eV is not optimal for low-level visible light sensing. The 1 eV band gap results in response well beyond the visible, and produces relatively high dark current levels.

Semiconductor devices comprised of gallium arsenide phosphide ($GaAs_{1-x}P_x$ where x is the compositional parameter) have been discussed in the literature, although such discussions have emphasized carrier recombination processes important for light emitting diodes (LEDs) or light displays. One published paper (*Characteristics and Potential Applications of $GaAs_{1-x}P_x$ MIS Structures, Solid-State Electronics,* 1974, Vol. 17, pp 25-29) discloses a GaAsP MOS structure for producing surface electroluminescence and hence a light display. This work points out a characteristic of GaAsP, viz, long charge-holding capability and low thermal generation of minority carriers. This paper, while addressing the matter of "imaging applications", clearly intends 'image-producing' as opposed to 'image-sensing'. In the present invention, 'image sensing' is addressed for the first time in GaAsP devices based upon MOS structures. As will be more fully discussed below, the present invention employs a GaAsP Mos structure: The MOS GaAsP structure has a high concentration of interface traps, a characteristic which has discouraged the use of GaAsP for light-sensing purposes. Such interface states trap light-produced minority carriers and seriously limit the transfer efficiency of GaAsP in charge-coupled device (CCD) applications. However, the present device employs a charge injection technique to sense light levels.

The published paper (*Noise Linearity and Trapped Charge Measurements with Charge Sensitive Amplifiers,* published in the *Proceedings of the 1975 International Conference on the Application of CCD,* October 29-31, San Diego, Calif.) discusses the measurement of trapped charges in CCDs by the use of a charge-sensitive amplifier. And, in charge-injection devices (CIDs), as disclosed in U.S. Pat. No. 3,805,062, use has been made of the difference in capacitance between a pre- and post-charge injection, as a measure of light-produced minority charges.

SUMMARY OF THE INVENTION

This invention provides a light sensing apparatus having low dark current, good charge-holding capability, and good SNR even at low light levels: The apparatus, according to this invention, employs a MOS GaAsP element. A negative voltage is applied to the metal electrode and a depletion region is created in the semiconductor surface. Under this potential condition, minority carriers generated by light are collected in the depletion region. The number of thermally generated minority carriers is negligibly small due to the low dark current. The collection of carriers leads to a change in capacitance of the MOS structure regardless of whether such collected charges are trapped or not. By positive pulsing of the gate electrode of the MOS structure, the collected charges, trapped or free, are neutralized by bulk carriers producing a change in capacitance of the MOS structure. This recombination current is integrated and is a measure of the amount of light received by the light sensing apparatus.

The ratio of arsenic to phosphorous in a GaAsP structure determines the energy band gap of the material. Thus, in a presently preferred form of the invention, $GaAs_{1-x}P_x$ is employed for light sensing purposes, x being a value somewhere between 0.3 and 0.5 and most preferably at about 0.5. With such a ratio of arsenic to phosphorous, the light sensing apparatus responds only to the visible spectrum. That is, $GaAs_{0.6}P_{0.4}$ has a strong absorption throughout the visible, with a sharp cutoff at about 680 nm. This corresponds to a band gap of about 1.8 eV.

The invention will be further described with reference to the Figures, of which:

FIG. 1 is a schematic diagram of a circuit according to the invention; and

FIG. 2 is a diagram useful in explaining the operation of the apparatus in FIG. 1.

Reference should be made to FIG. 1: An n-type $GaAs_{1-x}P_x$ sensor (10) constitutes the light receiving element of the invention and is provided with a transparent oxide coating 12 and a gate electrode 14, the elements 10, 12 and 14 forming a MOS capacitor. The oxide coating 12 is formed on the light-receiving element 10 by anodic oxidation of the $GaAs_{1-x}P_x$ in a tartaric acid and ethylene glycol electrolyte, after which the oxide coated element is heated in a hydrogen or argon atmosphere. Evaporated chromium serves as the gate electrode 14; and although the chromium gate electrode 14 is opaque, light entering an annular region 15 of the $GaAs_{1-x}P_x$ can produce signal charge, the diffusion length for minority carriers in n-type $GaAs_{1-x}P_x$ being sufficiently long to allow photon produced minority carriers to collect under the gate electrode 14. In other forms of the device, transparent electrodes can be employed to increase the sensitivity.

A bias voltage $V_b$(−20 volts) for creating a depletion region within the $GaAs_{1-x}P_x$ is applied to the gate electrode 14; and a pulse generator 16 for producing positive-going pulses $V_a$ is also coupled, capacitively, to the gate electrode 14, and may be triggered at any desired frequency as is the practice in the art. The pulse output $V_a$ of the pulse generator 16 is of such magnitude (about +25 volts) that it overrides the bias voltage $-V_b$ and, in so doing, injects carrier charges into the depletion region of the light receiving element 10.

A circuit for measuring the net level of recombination charge injected into the $GaAs_{1-x}P_x$ depletion region is connected to the light receiving element 10 and employs an operational amplifier 18, one input of which is connected to the light receiving element, and the other input of which is grounded. A charge-integrating capacitor 20 is connected from the output to the input of the operational amplifier 18; and a reset switch 22 is connected across the capacitor 20 to discharge the capacitor 20 at a frequency dependent on the triggering frequency of the pulse generator. Of course, the switch 22 is open during application of the charge injection pulse to the gate electrode 14.

During a light integrating period in which the bias voltage $-V_b$ creates a depletion region within the light receiving element 10, light produced minority carriers collect in such region. The carriers are trapped at the interface between the element 10 and its anodic oxide layer 12. By pulsing (16) the gate electrode 14, majority carriers from the bulk are injected into the interface and allowed to recombine with the trapped minority carriers. That is, at time t=0 of the charge injecting pulse (16), a current spike appears at the input of the amplifier 18, the current spike decaying to zero when all photon-produced charges have recombined. See FIG. 2a. The injected charges charge the capacitor 20 (FIG. 2b) and, at time $t=t_1$, when the charge-injection pulse ends, the capacitor 20 discharges (FIG. 2a) to neutralize the displacement charges existing in the GaAsP element. A voltage appears at the output of the amplifier 18 corresponding to the amount of light-produced charges which are present in the $GaAs_{1-x}P_x$ material.

Because of the relatively large energy band gap of $GaAs_{1-x}P_x$ (x=0.4), thermally generated charges do not contribute significantly to the output signal. Thus, the apparatus of FIG. 2 may be employed (1) to measure extremely low light levels, (2) to integrate light levels over extended periods of time, and (3) to store light produced carrier charges for hundreds of seconds. By properly selecting the ratio of arsenic to phosphorous in the GaAsP material, the apparatus of FIG. 1 will serve as its own filter to render the FIG. 1 structure spectrally sensitive only to visible radiation.

Although the invention has been described in connection with a single element light sensing apparatus, it will be appreciated that the invention may be employed in the form of an array of MOS structures, e.g., in the form of an area array. In this connection, it will be further appreciated that individual light sensing elements of such an array will need to be individually addressed, say, by column-and-row selecting apparatus as is known in the art.

The invention has been described in detail with particular reference to a certain preferred embodiment thereof, but it will be understood that variations and modifications can be effected within the spirit and scope of the invention. For example, a transparent electrode structure may be substituted for the opaque chromium gate electrode 14 of FIG. 2. And although n-type GaAsP has been used in connection with the apparatus of FIG. 2, p-type GaAsP may be used instead, provided, of course, that the various voltages indicated are reversed in polarity.

What is claimed is:

1. Light sensing metal-oxide-semiconductor (MOS) apparatus comprising:
   (a) a bulk of impurity-doped GaAsP;
   (b) an electrically nonconductive natively-grown oxide of GaAsP covering part of said bulk;
   (c) electrically conductive means covering at least part of said electrically nonconductive oxide of GaAsP, thereby to form a capacitor comprised of said bulk, said electrically nonconductive oxide, and said electrically conductive means, said oxide and said electrically conductive means being adapted to allow light to enter said bulk;
   (d) means for applying a bias voltage to said conductive means for depleting majority carriers from the interface between said electrically nonconductive oxide and said bulk;
   (e) means for applying a voltage pulse to said electrically conductive means, said pulse being of a polarity to inject majority carriers into the depletion region;
   (f) an electrical conductor in contact with said bulk; and
   (g) means cooperative with said conductor for measuring the quantity of said injected carriers, said GaAsP being of the form $GaAs_{1-x}P_x$, and wherein x is a number between 0.3 and 0.5.

2. The apparatus of claim 1 wherein said GaAsP is of the form $GaAs_{1-x}P_x$ and wherein x is a number about equal to 0.4.

3. Apparatus of claim 1 wherein said measuring means is a circuit for measuring the change in the capacitance of the capacitor formed from said GaAsP, said electrically nonconductive oxide, and said electrically conductive means as a result of pulsing said electrically conductive means.

4. Light sensing metal-oxide-semiconductor (MOS) apparatus comprising:
   (a) a light sensing element;
   (b) means for producing a bias potential;
   (c) means for producing a pulse having an amplitude greater than said bias potential, and of a polarity opposite to that of said bias potential,
   said light sensing element being comprised of GaAsP having an overlay of a transparent electrically nonconductive oxide of GaAsP and an electrically conductive element so overlaying the nonconductive overlay that light may enter said GaAsP via said nonconductive overlay;
   (d) means for selectively applying said bias potential and said pulse to said electrically conductive element of said light sensing element, said bias potential being sufficient to create a region within said GaAsP which is depleted of majority carriers, and said pulse is of a magnitude sufficient to inject light produced majority carriers into said depletion region; and
   (e) means cooperative with said light sensing element for measuring the amount of charge injected into said depletion region,
   said GaAsP being of the form $GaAs_{1-x}P_x$, and wherein x is a number between 0.3 and 0.5.

5. The apparatus of claim 4 wherein said GaAsP is of the form $GaAs_{1-x}P_x$ and wherein x is a number about equal to 0.4.

6. Apparatus of claim 4 wherein said measuring means is a circuit for measuring the change in the capacitance of the capacitor formed from said GaAsP, said electrically nonconductive oxide and said electrically conductive means as a result of pulsing said electrically conductive means.

* * * * *